(12) United States Patent
Imanishi et al.

(10) Patent No.: US 8,358,018 B2
(45) Date of Patent: Jan. 22, 2013

(54) RESIN SEALING STRUCTURE FOR ELECTRONIC COMPONENT AND RESIN SEALING METHOD FOR ELECTRONIC COMPONENT

(75) Inventors: Makoto Imanishi, Osaka (JP); Yoshihiro Tomura, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 12/431,855

(22) Filed: Apr. 29, 2009

(65) Prior Publication Data

US 2009/0278265 A1    Nov. 12, 2009

(30) Foreign Application Priority Data

May 7, 2008    (JP) ................. 2008-121166

(51) Int. Cl.
     *H01L 23/29*      (2006.01)

(52) U.S. Cl. ........ 257/790; 257/778; 257/783; 257/784; 257/791; 438/108; 438/118; 438/127

(58) Field of Classification Search ................. 257/787, 257/788, 789, 790, 791, 792, 793, 678, 734, 257/778, 781, 782, 783, 784, 786, 667, 753, 257/795, 690, 779, 780; 438/106, 108, 125, 438/126, 127, 109, 118; 361/760, 761, 762, 361/763, 764

See application file for complete search history.

(56) References Cited

U.S. PATENT DOCUMENTS

| | | | | |
|---|---|---|---|---|
| 5,629,566 A * | 5/1997 | Doi et al. | ....................... | 257/789 |
| 6,707,166 B1 * | 3/2004 | Noguchi | ....................... | 257/790 |
| 6,791,197 B1 | 9/2004 | Katz | ....................... | 257/786 |
| 6,815,263 B2 * | 11/2004 | Rissing et al. | ....................... | 438/127 |
| 6,888,222 B2 * | 5/2005 | Shizuno | ....................... | 257/618 |
| 7,145,253 B1 * | 12/2006 | Kim et al. | ....................... | 257/790 |
| 7,148,560 B2 * | 12/2006 | Lee et al. | ....................... | 257/667 |
| 2002/0102769 A1 * | 8/2002 | Shibue | ....................... | 438/108 |
| 2002/0125557 A1 | 9/2002 | Chen et al. | ....................... | 257/686 |
| 2003/0006493 A1 * | 1/2003 | Shimoishizaka et al. | ...... | 257/686 |
| 2004/0026768 A1 * | 2/2004 | Taar et al. | ....................... | 257/686 |
| 2004/0150118 A1 * | 8/2004 | Honda | ....................... | 257/778 |
| 2004/0178487 A1 | 9/2004 | Tanemura | ....................... | 257/678 |
| 2004/0188699 A1 * | 9/2004 | Kameyama et al. | ............ | 257/99 |
| 2005/0093178 A1 * | 5/2005 | Huang et al. | ....................... | 257/787 |
| 2006/0049532 A1 * | 3/2006 | Puschner et al. | ....................... | 257/788 |
| 2007/0075441 A1 | 4/2007 | Lee et al. | ....................... | 257/787 |

FOREIGN PATENT DOCUMENTS

| | | |
|---|---|---|
| JP | 63-111653 | 5/1988 |
| JP | 63-300508 | 12/1988 |
| JP | 64-5449 | 2/1989 |
| JP | 2-025015 | 1/1990 |
| JP | 4-356936 | 12/1992 |
| JP | 10-064854 | 3/1998 |
| JP | 10-064855 | 3/1998 |

\* cited by examiner

*Primary Examiner* — Ha Tran T Nguyen
*Assistant Examiner* — Thanh Y Tran
(74) *Attorney, Agent, or Firm* — Steptoe & Johnson LLP

(57) ABSTRACT

An electronic component, in which the outer perimeter portion of a component (2) is surrounded with a first sealing resin (4), a second sealing resin (3) is filled within the periphery of the first sealing resin (4), the component (2) and a board (1) are electrically connected by a wire (5), the edge, in the vicinity of which the wire (5) passes, of the outer perimeter edge portions of the component (2) is formed to be a chamfered oblique surface (31), and the wire (5) is provided to extend to the board (1) along the oblique surface (31). By this means, the overall height of the electronic component can be kept low.

2 Claims, 9 Drawing Sheets

RESIN SEALING STRUCTURE FOR ELECTRONIC COMPONENT AND RESIN SEALING METHOD FOR ELECTRONIC COMPONENT

BACKGROUND OF THE INVENTION

1. Field of the Invention

The present invention relates to an electronic component packaged with resin.

2. Description of the Related Art

In recent years, progress has been made in reducing the thickness of electronic component packages. For example, in the case of circuit boards which are used in memory cards, it is essential to reduce thickness due to the restriction on the thickness dimensions of the product. Therefore, it has been necessary to reduce the respective thicknesses of the circuit board, electronic components, wires, resin, cover and the like, which are the constituent components of the product.

In view of these circumstances, if wires make contact with the edge portions of the component, there are problems in that shorting between mutually adjacent wires occurs via the conductive film on the component, and malfunction of the electronic component occurs due to leaking into the component of the signals flowing in the wires.

In order to resolve these problems, the method shown in FIG. 10 is conceived in Japanese Patent Application Laid-open No. H 4-356936.

FIG. 10 shows technology whereby the position of a bump 14 is decided in such a manner that the angle θ formed between the surface F of the component 2A and the straight line E-H that links the edge portion E of the outer perimeter of the component 2A and the end portion H of the bump 14 formed on the component 2A is equal to or greater than 30°, thereby preventing a wire 5 from being shorted to the edge portion E of the component 2A.

However, in Japanese Patent Application Laid-open No. H 4-356936, if the distance between the edge portion E of the component 2A and the end portion H of the bump is increased, then the height of the bump 14 required to ensure an angle θ of 30° or above becomes greater, and the height of the whole mounting structure becomes greater. More specifically, if the distance between the edge portion E and the end portion H is 0.2 mm, then the height of the bump 14 is equal to or greater than 0.1 mm. If the height of the bump 14 becomes greater, then variation in the height shape of the actual wiring loop of the wire 5 becomes greater, and if there is any dangling of the wire 5 before packaging with resin, then the wire 5 may make contact with the edge portion E of the component 2A.

FIG. 11 depicts a state where the wiring shown in FIG. 10 has been completed and a resin package has then been made using a sealing resin 30; in this case, mounding 12 was observed in the position corresponding to the outer perimeter of the component 2A. The sealing height is raised by the mounding 12 of the sealing resin 30, and hence it is not possible to reduce the overall height of the electronic component. The resin used as a sealing resin 30 is a Chipcoat No. 8408 insulating material made by Namics Corporation having a viscosity of 35.0 Pa·s (at 25° C.) and a coefficient of elasticity of approximately 7.8 GPa.

SUMMARY OF THE INVENTION

The present invention was devised in view of the foregoing circumstances, an object thereof being to provide an electronic component and a resin packaging method for an electronic component whereby the overall height of the electronic component can be restricted to a low height.

The electronic component of the present invention is an electronic component in which a component installed on a board is sealed with resin, comprising: a first sealing resin surrounding the outer perimeter portion of the component; and a second sealing resin filled within the periphery of the first sealing resin and covering the component, the second sealing resin being softer than the first sealing resin.

In the electronic component of the present invention, the component and the board are electrically connected by a wire, a portion or all of an edge, in the vicinity where the wire passes, of edge portions of the outer perimeter of the component is formed to be a chamfered oblique surface, and the wire is provided to extend to the board along the oblique surface.

In the electronic component according to the present invention, an electrical insulating material is interposed between the wire and the chamfered oblique surface of the component.

In the electronic component of the present invention, the component is a semiconductor chip.

A resin packaging method for an electronic component according to the present invention comprises, when a component installed on a board is sealed with resin, supplying and curing a first sealing resin of a first viscosity so as to surround the outer perimeter portion of the component on the board; and filling and curing a second sealing resin that has a lower viscosity than the first viscosity within the periphery of the first sealing resin so as to cover the component.

In the resin packaging method for an electronic component according to the present invention, the first sealing resin and the second sealing resin are made of different materials.

In the resin packaging method for an electronic component according to the present invention, the first sealing resin and the second sealing resin are made of the same material, the first sealing resin at a first resin temperature is supplied onto the board so as to surround the outer perimeter portion of the component, and the second sealing resin at a second resin temperature that is higher than the first resin temperature is filled within the periphery of the first sealing resin.

The resin packaging method for an electronic component according to the present invention comprises the steps of: chamfering a portion or all of an edge, in the vicinity where a wire passes, of edge portions of the outer perimeter of the component to have an oblique surface; and disposing the wire so as to extend and connect to the board along the chamfered oblique surface.

The resin packaging method for an electronic component according to the present invention comprises the steps of: chamfering a portion or all of an edge, in the vicinity where a wire passes, of edge portions of the outer perimeter of the component to have an oblique surface; supplying an electrical insulating material to the chamfered oblique surface of the component; and tensioning an intermediate portion of the wire connecting the component to the board so as to make contact with the electrical insulating material.

The resin packaging method for an electronic component according to the present invention comprises, when a component installed on a board is sealed with resin, the steps of: supplying a first sealing resin of a first viscosity so as to surround the outer perimeter portion of the component on the board; filling a second sealing resin that has a lower viscosity than the first viscosity within the periphery of the first sealing resin so as to cover the component; and curing the first sealing resin and the second sealing resin at the same time.

In the present invention, since the second sealing resin which is softer than the first sealing resin is positioned to the inner side of the first sealing resin which surrounds the outer perimeter section of the component, then it is possible to reduce mounding of the resin corresponding to the outer perimeter edge portion of the component. Moreover, by chamfering a portion or all of an edge, in the vicinity where the wire passes, of edge portions of the outer perimeter of the component and by providing the wire so as to extend to the board along the chamfered oblique surface, it is possible further to reduce mounding of the resin and therefore the overall height of the electronic component can be restricted.

Furthermore, when sealing the component installed on the board by means of resin, since a first sealing resin is supplied and cured so as to surround the outer perimeter portion of the component whereupon a second sealing resin having a lower viscosity than the first viscosity is filled and cured within the periphery of the first sealing resin, it is possible to reduce mounding corresponding to the outer perimeter edge portion of the component when the second sealing resin has cured, and therefore the overall height of the electronic component can be restricted.

Moreover, since the method of the present invention seals a component installed on a board with resin, by comprising the steps of supplying a first sealing resin of a first viscosity so as to surround the outer perimeter portion of the component on the board, filling a second sealing resin having a lower viscosity than the first viscosity to the inside of the first sealing resin so as to cover the component, and curing the first sealing resin and the second sealing resin at the same time, then it is possible to restrict mounding corresponding to the outer perimeter edge portion of the component when the second sealing resin has cured, and therefore the overall height of the electronic component can be restricted.

Moreover, by interposing an electrical insulating material between the wire and the chamfered oblique surface of the component, it is possible to prevent accidental electrical conduction between the wire and the component.

DESCRIPTION OF THE PREFERRED EMBODIMENTS

First Embodiment

FIGS. 1A and 1B to FIG. 4 show a first embodiment of the present invention.

Figure 1A:
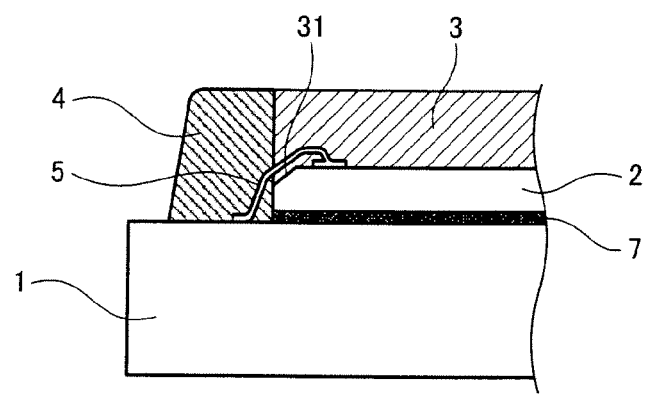
FIG. 1A is a cross-sectional diagram of an electronic component according to a first embodiment of the present invention.

FIG. 1A shows an electronic component according to the present invention.

In this electronic component, a semiconductor chip 2, which is a component, is die bonded by a die attach film 7 to the upper surface of a circuit board 1, and an electrode of the semiconductor chip 2 and an electrode of the board 1 are bonded by a wire 5.

A resin package is formed by supplying and curing a first sealing resin 4 so as to surround the outer perimeter portion of the semiconductor chip 2 on the upper surface of the board 1, and then filling and curing a second sealing resin 3 inside the first sealing resin 4 so as to cover the semiconductor chip 2.

The viscosity of the second sealing resin 3 during filling is lower than the viscosity of the first sealing resin 4 during filling, while the coefficient of elasticity of the second sealing resin 3 after curing is lower than the coefficient of elasticity of the first sealing resin 4 after curing, and the second sealing resin 3 after curing is softer than the first sealing resin 4 after curing.

When applying the second sealing resin 3 to the surface of the semiconductor chip 2, as well as using a resin having low viscosity in order to improve wetting and spreading, an atmospheric pressure plasma is applied before the application of the resin in order to improve wetting properties.

More specifically, the semiconductor chip 2 used has dimensions of 8 mm×11 mm and a thickness of 0.085 mm, and a metal wire having a diameter of 0.025 mm is used for the wire 5. A Chipcoat No. 8408 insulating material made by Namics Corporation (viscosity 35.0 (Pa·s) (at 25° C.)) is used as the first sealing resin 4. A Chipcoat No. 8420 insulating material made by Namics Corporation (viscosity 6.0 (Pa·s) (at 25° C.)) is used as the second sealing resin 3.

Of the edge portion of the outer perimeter of the semiconductor chip 2, the edge in the vicinity of which the wire 5 passes is chamfered at an angle of θ to produce an oblique surface 31.

Figure 2A:
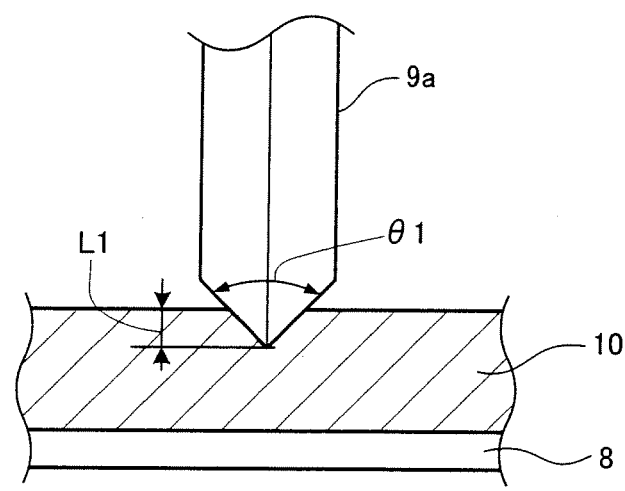
FIG. 2A is a step diagram showing processing of the edge portion of the outer perimeter of the semiconductor chip according to this embodiment.
Figure 2B:
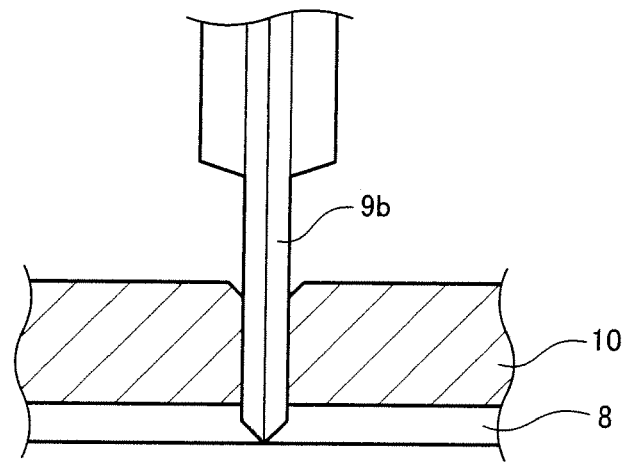
FIG. 2B is a step diagram showing processing of the edge portion of the outer perimeter of the semiconductor chip according to this embodiment.

FIG. 2A and FIG. 2B show steps for processing the oblique surface 31 on the semiconductor chip 2.

In FIG. 2A, a semiconductor chip 10 in the form of a wafer is attached to a sheet 8, and in this state a cutting mark having a depth of L1 is inserted from above into the semiconductor chip 10 with a cutter blade 9a. Thereupon, the semiconductor chip 10 is cut until reaching the sheet 8 by means of a cutter blade 9b which is thinner than the cutter blade 9a, as shown in FIG. 2B.

In order to show the cutting area, the cut object is shown in cross-sectional view and the rotational cutter blade is not shown in cross-section.

The oblique surface can be processed when dicing the semiconductor chip 2 from the wafer, by using for the dicing step the cutter 9a of which the tip has been manufactured to have a shape with the same angle as the angle of the processed portion of the semiconductor chip 2, as shown in FIG. 2A. Thereupon, dicing is carried out using a normal cutter blade tip which is not formed with an angle.

When dicing the semiconductor chip 2 from the wafer, a similar oblique portion is formed if a bevel cut is used to prevent chipping, but in the first embodiment, the oblique portion is actively formed, differently from a bevel cut.

A bevel cut involves forming a very small processing shape (about 4 μm) using the front tip of a cutter blade having a tip broadening angle of approximately 120°, but in FIG. 2A, an angle of 45° is processed in the semiconductor chip 10 using the tip of a cutter blade 9a having an angle of θ1=90°, the chip being processed through 0.04 mm in the breadthways direction, and therefore a large processed shape is formed actively and the object of the present invention is achieved. Moreover, in the breadthways direction, in particular if the wire 5 is long, for instance, the semiconductor chip 2 may be processed to the inner side from the scribe line of the semiconductor chip 2 with the use of the cutter blade 9b.

Figure 1B:
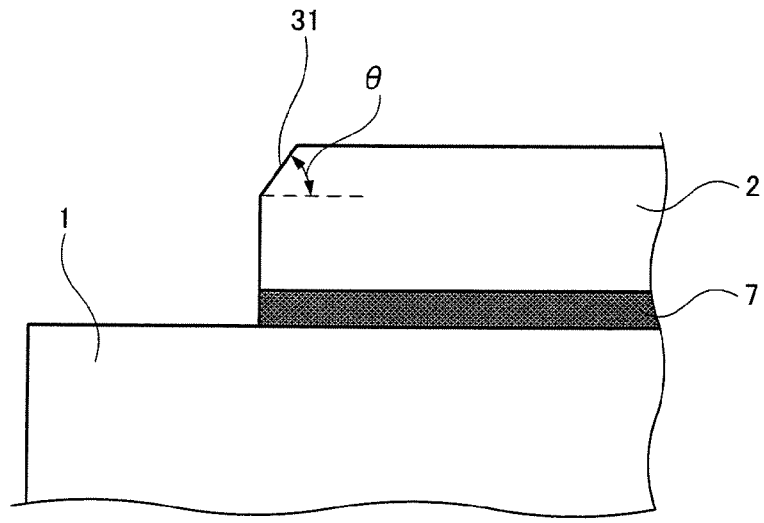
FIG. 1B is a cross-sectional diagram showing the edge portion of the outer perimeter of a semiconductor chip according to this embodiment.

The angle θ can be set from 30° to 75°. As shown in FIG. 1B, this angle θ is defined by taking the planar direction parallel to the surface of the board 1 as 0°. If the angle is 30° or less, then the semiconductor chip 2 is liable to be chipped, whereas if the angle is 75° or greater, then the beneficial effects of adopting an oblique corner section are not obtained.

Desirably, the angle is 40° to 55°.

As FIG. 1A reveals, the wire 5 electrically connects the semiconductor chip 2 with the board 1 by extending along the oblique surface 31.

Furthermore, FIG. 1A shows only a cross-sectional diagram in a direction intersecting with an edge of the semiconductor chip 2 where the wire 5 electrically connecting the semiconductor chip 2 and the board 1 is present, but the semiconductor chip 2 is made more stable by omitting the oblique surface 31 on the edges of the semiconductor chip 2 where the wire 5 is not present.

Figure 3:
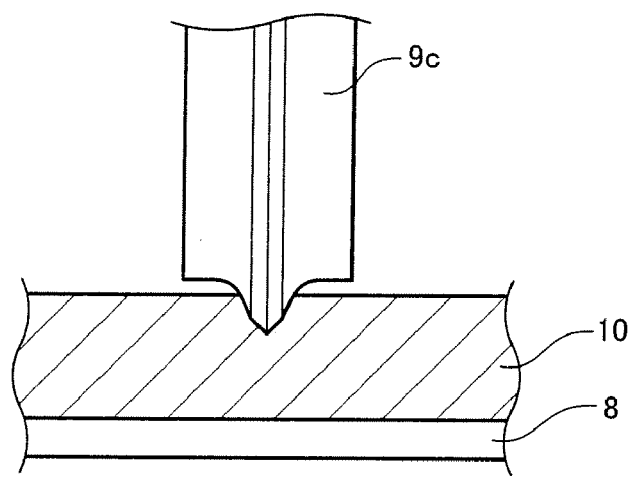
FIG. 3 is an explanatory diagram of a cutter blade 9c having a tip formed with a rounded shape on the side of the semiconductor chip 2.

Moreover, in the case of a semiconductor chip 2 made of a soft material, chipping of the corner sections is a concern, and in this case, a rounded shape can be applied by using a cutter blade 9c having a rounded tip shape on the side of the semiconductor chip 2, as shown in FIG. 3. Applying a rounded shape in this way makes chipping less liable to occur.

Figure 4:
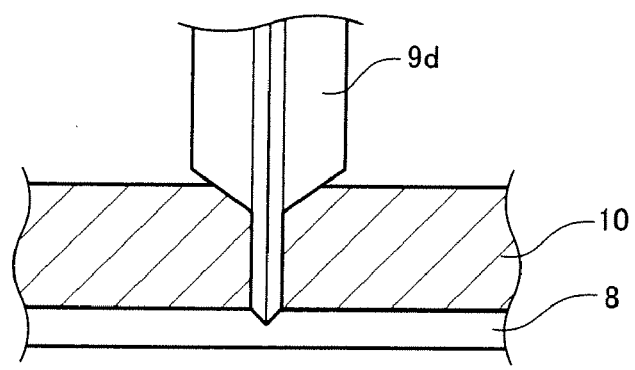
FIG. 4 is an explanatory diagram of a case where the cutter blade tip has a two-stage composition.

Moreover, if the tip of the cutter blade is formed into a two-stage cutter blade 9d as shown in FIG. 4, then the dicing step can be completed in one operation, which is simpler.

By using a semiconductor chip 2 processed in this way, the wire 5 is prevented from making contact with the edge portion of the outer perimeter of the semiconductor chip 2. Furthermore, since the second sealing resin 3 in the portion corresponding to the outer perimeter of the semiconductor chip 2 is not mounded up, due to surface tension, then it is possible to restrict the overall height of the electronic component.

In the prior art, measuring the highest point of the wire 5 from the surface of the semiconductor chip 2, the smallest possible average height is 0.07 mm, taking account of variation in the wiring height, but in the case of the first embodiment, this can be reduced to 0.05 mm. Moreover, in the case of the prior art, the mounding of the sealing resin in the portion corresponding to the outer perimeter of the semiconductor chip 2 is 0.02 mm from the surface of the sealing resin on the semiconductor chip 2, but this can be reduced to approximately 0.005 mm in the case of the first embodiment.

The wire 5 has a first point on top of the semiconductor chip 2 and a second point on top of a bump on the board 1 (a descending wire), but similar beneficial effects are obtained if, after forming a bump on the semiconductor chip 2, the first point is on the board 1 and the second point is on the semiconductor chip 2 (an ascending wire).

Furthermore, in this method, the semiconductor chip 2 can be processed selectively if the semiconductor chip 2 has edges which it is not desired to process, and therefore it is also possible to process only the edge where the wire 5 is present, or only a portion of a plurality of edges where wires 5 are present.

In this first embodiment, the semiconductor chip 2 was described as a component, but the present invention can also be adapted in a similar fashion to other electronic components.

Moreover, in an ideal shape, the position of the lower side of the oblique surface 31 in FIG. 1B is desirably located in the approximate halfway portion of the thickness of the semiconductor chip 10. In other words, if the position of the lower side of the oblique surface 31 is below the halfway position of the thickness of the semiconductor chip 10, then there is a high probability of breaking of the semiconductor chip 10 during processing or mounting. On the other hand, if the position of the lower side of the oblique surface 31 is higher than the halfway position of the thickness of the semiconductor chip 10, then the chip makes contact with the wire 5.

This is particularly valuable if the thickness of the semiconductor chip 2 is 0.1 mm or less. This is because as the semiconductor chip 2 becomes thinner, defects due to chipping and warping become more liable to occur.

Second Embodiment

Figure 5A:
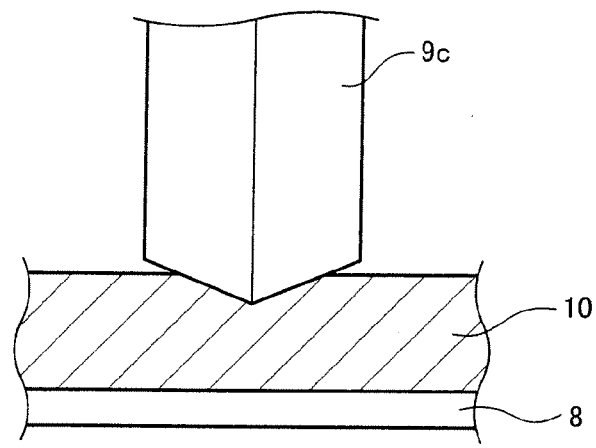
FIG. 5A is a cross-sectional diagram of a step of processing the end portion of a semiconductor chip according to a second embodiment of the present invention.
Figure 5B:
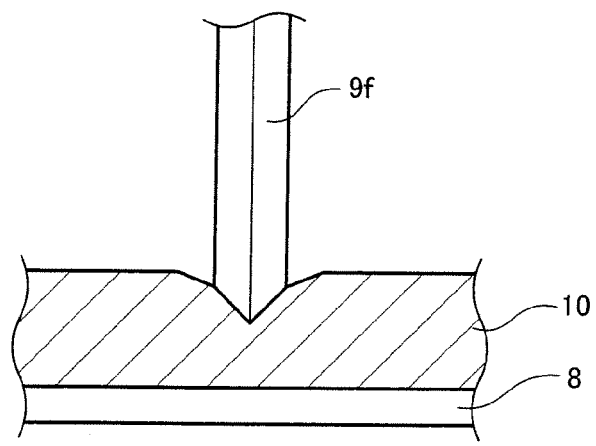
FIG. 5B is a cross-sectional diagram of a step of processing the end portion of the semiconductor chip according to this embodiment.
Figure 5C:
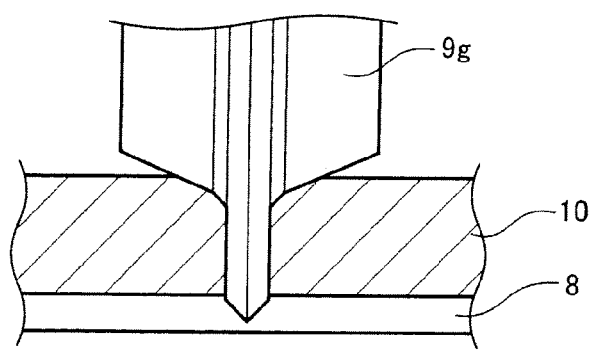
FIG. 5C is a cross-sectional diagram of the tip of a cutter blade according to this embodiment.

FIG. 5A, FIG. 5B and FIG. 5C show a second embodiment of the present invention.

The point of difference with respect to the first embodiment is that when dicing a semiconductor chip 2 from a wafer, two cutter blades 9c and 9f having different blade tip angles are used, and a two-stage processed shape is formed by firstly carrying out first stage processing using the cutter blade 9c having a larger blade tip angle (FIG. 5A) and then carrying out second stage processing using the cutter blade 9f having a smaller blade tip angle (FIG. 5B).

More specifically, the blade tip angle of the cutter blade 9c is 135° and the blade tip angle of the cutter blade 9f is 90°.

As shown in FIG. 1, when the electrode on the board 1 side is close to the outer perimeter of the semiconductor chip 2, then the wire 5 may have a double bend shape and in cases such as this, the height of the wire 5 can be lowered further by processing the oblique surface 31 in two stages so as to have a gradient that changes at an intermediate point. More specifically, the height of the wire 5 can be lowered by approximately 0.005 mm compared to the one-stage processing by the 90° blade tip shown in FIG. 2A.

By composing the cutter blade tip as shown in FIG. 5C, the dicing step can be completed in a single operation and hence the dicing step is simplified.

By adopting a shape following the wire 5 shown in the first embodiment by means of two-stage processing, an even more desirable composition is achieved, and preferably, the angle of the line linking the two-stage projection is 30° to 75°. Furthermore, a rounded shape may be applied to each stage. Besides a two-stage shape, it is also possible to adopt a step shape having multiple stages.

Third Embodiment

FIGS. 6A to 6E show a third embodiment of the present invention.

In the first embodiment and the second embodiment, a cutter blade was used when fabricating a semiconductor chip 2 from a wafer, but the present embodiment differs from this in that etching is used.

Figure 6A:
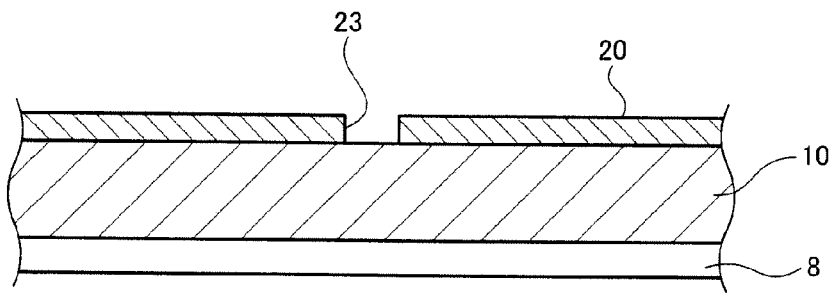
FIG. 6A is a diagram of a process according to a third embodiment of the present invention.
Figure 6B:
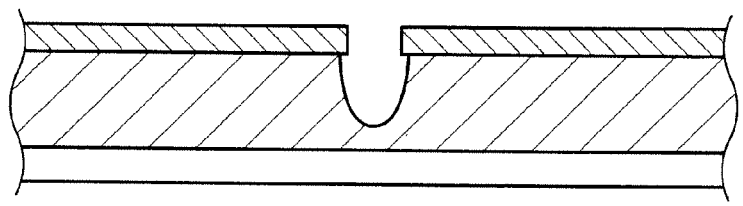
FIG. 6B is a diagram of a process according to this embodiment.

As shown in FIG. 6A, a semiconductor chip 10 in the form of a wafer is attached to a sheet 8, and in this state a first resist 20 is formed on the surface of the semiconductor chip 10. An opening section 22 is etched using an etching solution. Holes with good S/N, in other words, large depth compared to the hole diameter, are formed using a solution having a high etching rate (FIG. 6B).

Figure 6C:
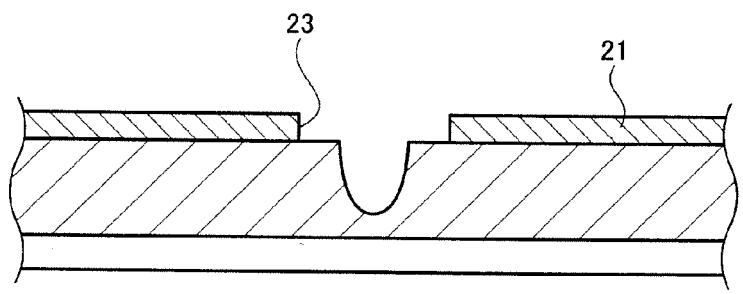
FIG. 6C is a diagram of a process according to this embodiment.
Figure 6D:
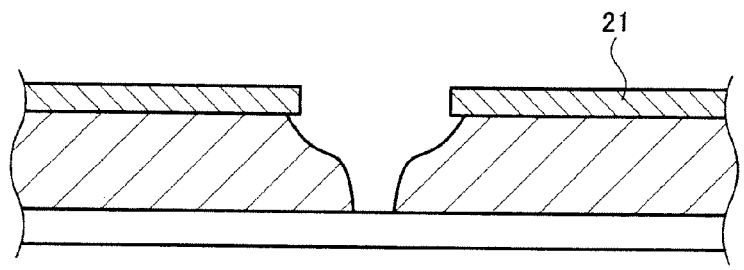
FIG. 6D is a diagram of a process according to this embodiment.

Thereupon, as shown in FIG. 6C, the first resist 20 is removed and a second resist 21 is formed. An opening section 23 which is larger than the opening section 22 is formed. Etching is then performed using an etching solution (FIG. 6D). The etching solution used has a low etching rate and performs shallow etching.

Figure 6E:
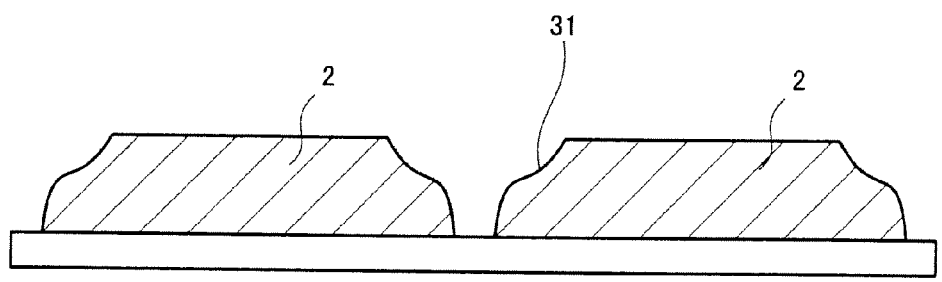
FIG. 6E is a cross-sectional diagram of a semiconductor chip manufactured by this embodiment.

Consequently, it is possible to manufacture a semiconductor chip 2 in which the oblique surface 31 has a two-stage shape, as shown in FIG. 6E. Since an etching process is used, a more rounded shape is applied than in the first embodiment or second embodiment.

A standard etching solution can be chosen as the etching solution. A standard resist film can be chosen as the resist film.

The resist uses a polyimide type of resin and hence a liquid which detaches and removes the resist film must be used. For the etching solution, it is possible to use a mixed acid etching solution. These materials are available commercially from various manufacturers. The concentration of the solution can also be raised in order to speed up the etching process. This can also be achieved by raising the processing temperature. The various required materials can be obtained from companies such as Kanto Chemical Co., Inc., Tokyo Ohka Kogyo Co., Ltd., Hayashi Pure Chemical Ind., Ltd., Wako Pure Chemical Industries, Ltd., or the like. The standard specifications of the respective materials used should be followed in setting the processing conditions, and the like.

Fourth Embodiment

Figure 7:
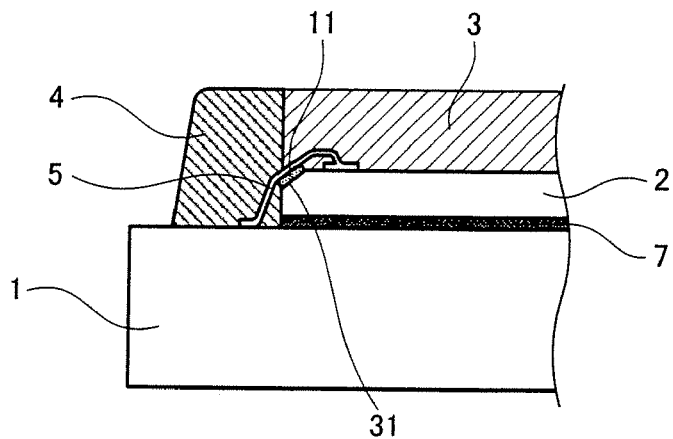
FIG. 7 is a cross-sectional diagram of an electronic component according to a fourth embodiment of the present invention.
Figure 8:
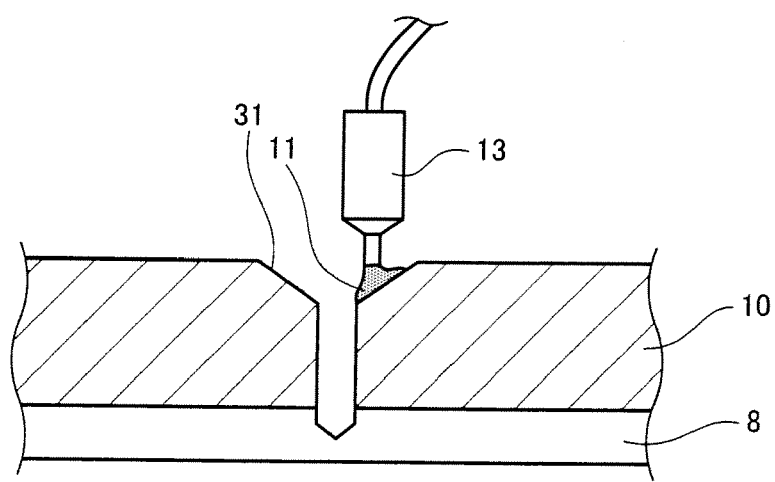
FIG. 8 is a general diagram of a method of applying an electrical insulating material according to this embodiment.

FIG. 7 and FIG. 8 show a fourth embodiment of the present invention.

In the respective embodiments described above, a semiconductor chip 2 and a board 1 are connected by a wire 5, and a second sealing resin 3 is filled while the middle portion of the wire 5 is in an unsupported state, but the fourth embodiment differs from this in that an electrical insulating material 11 is sandwiched between the wire 5 and the oblique surface 31, as shown in FIG. 7.

There are problems in that neighboring wires 5 may short out via the conductive film on top of the semiconductor chip 2, or the signal flowing in the wire 5 may leak out into the semiconductor chip 2, leading to malfunction of the semiconductor chip 2.

In response to this, in the fourth embodiment, this problem is resolved by applying an electrical insulating material 11 to the oblique surface 31. More specifically, the electrical insulating material 11 is polyimide and its thickness is 0.005 mm. An underfill application method using a general application syringe 13 such as that shown in FIG. 8 can be used to apply this electrical insulating material 11.

In this case, when one end of the wire 5 has been bonded to the semiconductor chip 2 and the wire 5 is extended toward the board 1 and bonded to the board 1, the intermediate portion of the wire 5 makes contact with the electrical insulating material 11 that has been applied and cured, and the wire 5 is pulled in such a manner that the electrical insulating material 11 is sandwiched between the oblique surface 31 of the semiconductor chip 2 and the wire 5.

Polyimide is used for the electrical insulating material 11, but if a light-curable type of electrical insulating resin 11 is used, then the electrical insulating resin 11 can be light-cured before falling off from the oblique surface 31, and therefore wasteful use of the electrical insulating resin can be suppressed.

Fifth Embodiment

Figure 9:
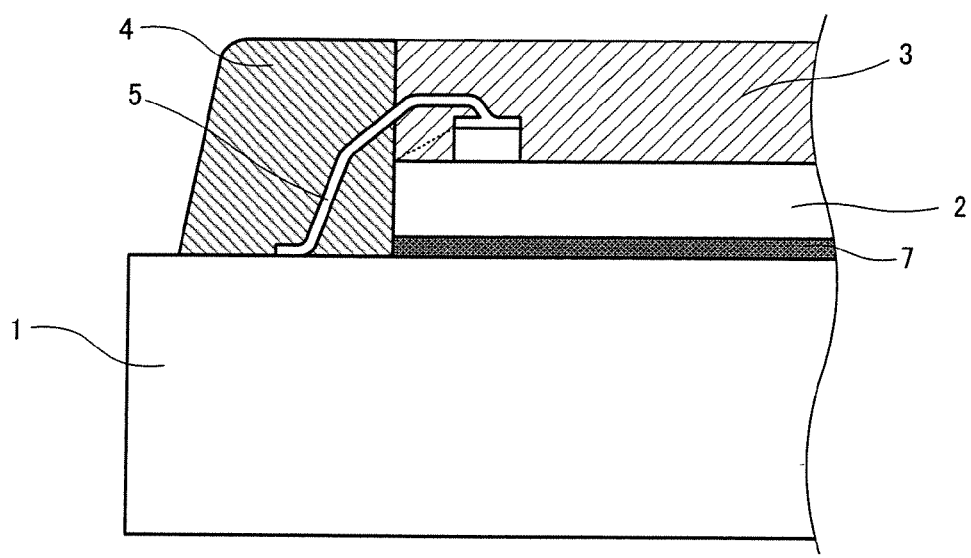
FIG. 9 is a cross-sectional diagram of an electronic component according to a fifth embodiment of the present invention.
Figure 10:
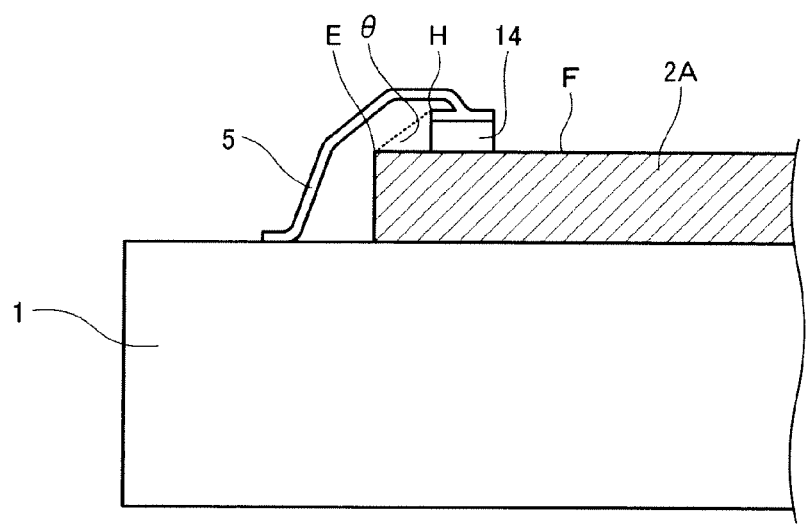
FIG. 10 is an enlarged cross-sectional diagram of an electronic component before sealing with resin according to a prior art example.
Figure 11:
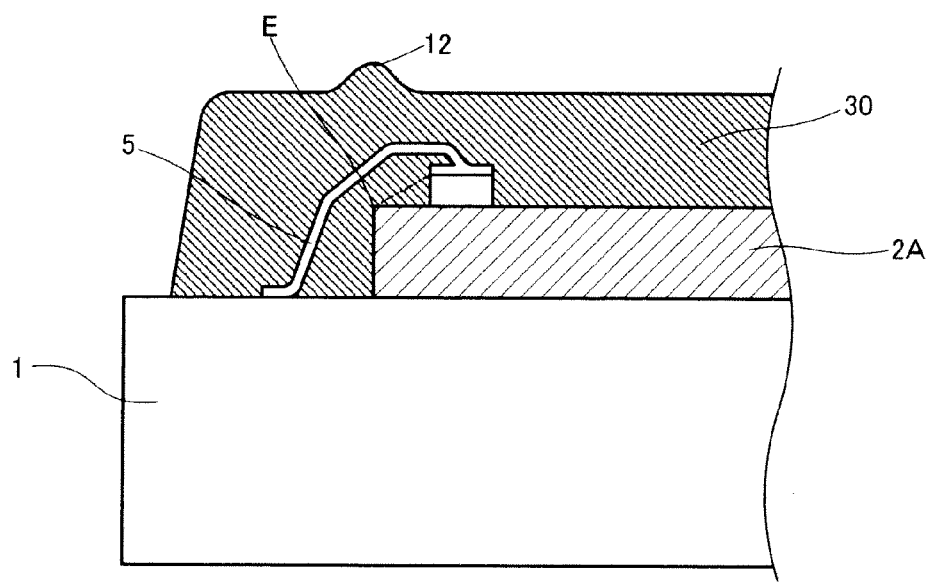
FIG. 11 is an enlarged cross-sectional diagram of an electronic component after sealing with resin according to the prior art example.

FIG. 9 shows a fifth embodiment of the present invention.

In the respective embodiments described above, an oblique surface 31 is formed by chamfering the edge portion of the outer perimeter of a semiconductor chip 2, a wire 5 is connected and a first sealing resin 4 and a second sealing resin 3 having different viscosities are filled in to seal the composition; however, the fifth embodiment differs from this in that the edge portion of the outer perimeter of the semiconductor chip 2 is not chamfered.

In a semiconductor chip 2 in which the edge portion of the outer perimeter of the chip has not been chamfered, simply by surrounding the outer perimeter portion of the chip 2 with a first sealing resin 4, and then filling and curing a second sealing resin 3, which has a lower viscosity than the viscosity of the first sealing resin 4 during filling, to the inner side of the first sealing resin 4, the significant mounding observed in the prior art does not occur in the portion corresponding to the outer perimeter of the semiconductor chip 2.

Figure 12:
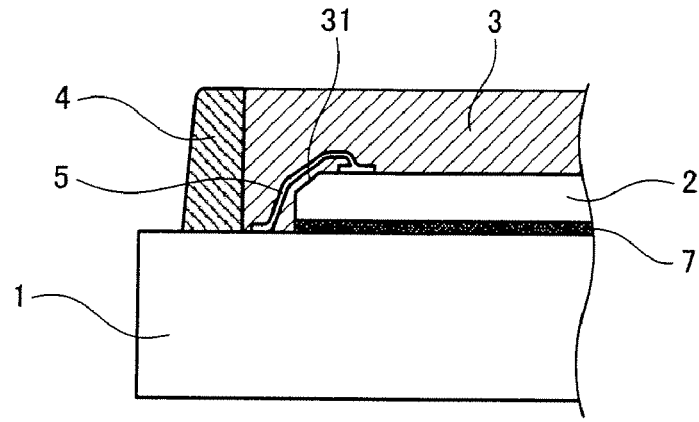
FIG. 12 is a cross-sectional diagram showing the principal part of an embodiment of the present invention.

Moreover, in the respective embodiments described above, the first sealing resin 4 makes contact with the outer perimeter of the semiconductor chip 2, but good results are obtained whether the first sealing resin 4 is separated from the outer perimeter of the semiconductor chip 2 as shown in FIG. 12, or whether the first sealing resin 4 lies in contact with the outer perimeter of the semiconductor chip 2.

Figure 13A:
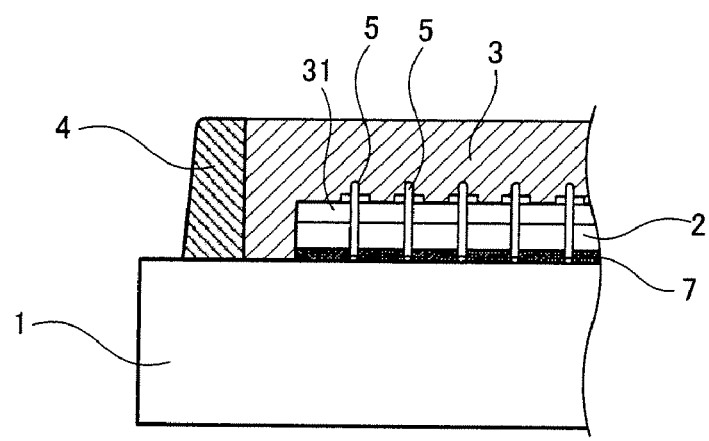
FIG. 13A is a side view diagram showing the principal part of the embodiment of the present invention.
Figure 13B:
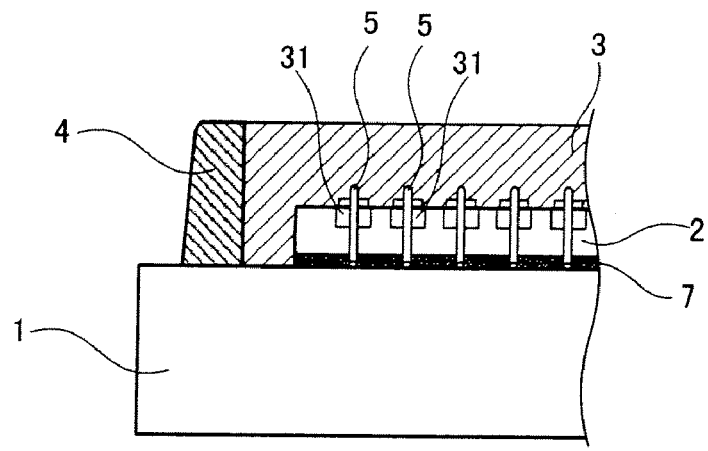
FIG. 13B is a side view diagram showing the principal part of the embodiment of the present invention.

The oblique surface 31 in the respective embodiments is formed on the whole of the edge of the semiconductor chip 2 where the wire 5 is extracted, as shown in FIG. 13A, but as shown in FIG. 13B, it is also possible to adopt a composition in which an oblique surface 31 is formed only in a portion of the edge of the semiconductor chip 2 where the wire 5 is extracted so as to correspond to the portion where the wire 5 passes.

In the respective embodiments described above, the first sealing resin 4 and the second sealing resin 3 may be composed of the same or different materials. More specifically, to give an example of materials used in a case where the first sealing resin 4 and the second sealing resin 3 have different compositions, for the first sealing resin 4, Namics Chipcoat No. 8408 having a viscosity of 35.0 (Pa·s) (at 25° C.) can be used, and for the second sealing resin 3, Namics Chipcoat No. 8420 having a viscosity of 6.0 (Pa·s) (at 25° C.) can be used.

To give an example of materials used when the first sealing resin 4 and the second sealing resin 3 have the same composition, Namics Chipcoat No. 8408 is used for both the first sealing resin 4 and the second sealing resin 3, and when filling the first sealing resin 4, the resin is filled in at a temperature of 25° C. and a viscosity of 35.0 (Pa·s), whereas when filling the second sealing resin 3, the resin is filled in at a temperature of 40° C. and a viscosity of 5.0 (Pa·s), the resin then being cured to yield a good electronic component in which significant mounding does not occur as in the prior art in the portion corresponding to the outer perimeter of the semiconductor chip 2.

The respective embodiments described above comprise a step of supplying and curing a first sealing resin 4 having a first viscosity so as to surround the outer perimeter portion of a semiconductor chip 2 on a circuit board 1, and a step of filling and curing a second sealing resin 3 having a lower viscosity than the first viscosity within the periphery of the first sealing resin 4 so as to cover the semiconductor chip 2, but rather than curing the first sealing resin 4 and then filling a second sealing resin 3, it is also possible to adopt a step of supplying a first sealing resin 4 of a first viscosity so as to surround the outer perimeter portion of a semiconductor chip 2 on a circuit board 1, a step of filling a second sealing resin 3 having a lower viscosity than the first viscosity within the periphery of the first sealing resin 4 so as to cover the semiconductor chip 2, and a step of curing the first sealing resin 4 and the second sealing resin 3 at the same time.

The present invention contributes to reducing the thickness and improving the reliability of electronic components of various types, such as memory cards.

What is claimed is:

1. An electronic component package comprising:
    an electronic component installed on a top surface of a board,
    a first sealing resin surrounding and contacting an outer perimeter portion of the electronic component; and
    a second sealing resin filled within a periphery of the first sealing resin and covering the top surface of the electronic component opposite the top surface of the board, the second sealing resin being softer than the first sealing resin,
    wherein the electronic component and the board are electrically connected by a wire which does not contact an edge of the electronic component and extends through the first sealing resin and the second sealing resin,
    at least a portion of an edge of the outer perimeter of the electronic component, in a vicinity where the wire passes, is a chamfered oblique surface, and
    the wire extends to the board along the chamfered oblique surface.

2. The electronic component package according to claim 1, wherein an electrical insulating material is interposed between the wire and the chamfered oblique surface of the electronic component.

* * * * *